United States Patent
Park et al.

(10) Patent No.: US 12,051,717 B2
(45) Date of Patent: Jul. 30, 2024

(54) ANTI-FERROELECTRIC THIN-FILM STRUCTURE AND ELECTRONIC DEVICE INCLUDING THE SAME

(71) Applicant: Samsung Electronics Co., Ltd., Suwon-si (KR)

(72) Inventors: Boeun Park, Hwaseong-si (KR); Yongsung Kim, Suwon-si (KR); Jeonggyu Song, Seongnam-si (KR); Jooho Lee, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 132 days.

(21) Appl. No.: 17/702,155

(22) Filed: Mar. 23, 2022

(65) Prior Publication Data

US 2023/0022629 A1    Jan. 26, 2023

(30) Foreign Application Priority Data

Jul. 22, 2021 (KR) .......................... 10-2021-0096717

(51) Int. Cl.
 *H10B 53/00* (2023.01)
 *H01L 49/02* (2006.01)

(52) U.S. Cl.
 CPC ............ *H01L 28/56* (2013.01); *H10B 53/00* (2023.02)

(58) Field of Classification Search
 CPC ....... H01L 28/55; H01L 28/56; H01L 29/516; H10B 53/00
 See application file for complete search history.

(56) References Cited

U.S. PATENT DOCUMENTS

| | | | |
|---|---|---|---|
| 8,009,454 B2 | 8/2011 | Lee et al. | |
| 2014/0355328 A1 | 12/2014 | Muller et al. | |
| 2019/0393232 A1 | 12/2019 | Chang et al. | |
| 2020/0194443 A1* | 6/2020 | Lin | H01L 28/60 |
| 2020/0286984 A1* | 9/2020 | Chang | H10B 12/315 |
| 2021/0115564 A1 | 4/2021 | Park et al. | |
| 2021/0359082 A1* | 11/2021 | Kang | H10B 53/30 |
| 2021/0359101 A1* | 11/2021 | Heo | H10B 53/30 |

(Continued)

FOREIGN PATENT DOCUMENTS

| | | | | |
|---|---|---|---|---|
| CN | 109216328 A | * | 1/2019 | ....... H01L 21/02181 |
| EP | 3799131 A1 | * | 3/2021 | .......... G11C 11/223 |
| JP | H05-190868 A | | 7/1993 | |

(Continued)

OTHER PUBLICATIONS

Dipijyoti Das et al: "Insertion of Dielectric Interlayer: a New Approach to Enhance Energy Storage in HfxZr1—xO2 Capacitors", IEEE Electron Device Letters, IEEE, USA, vol. 42, No. 3 pp. 331-334; (Jan. 27, 2021), XP011839907.

(Continued)

*Primary Examiner* — Matthew E Warren
(74) *Attorney, Agent, or Firm* — Harness, Dickey & Pierce, P.L.C.

(57) ABSTRACT

An anti-ferroelectric thin-film structure including a dielectric layer including an anti-ferroelectric phase of hafnium oxide; and an inserted layer in the dielectric layer, the inserted layer including an oxide. An electronic device to which the anti-ferroelectric thin-film structure has been applied may secure an operating voltage section with little hysteresis.

27 Claims, 15 Drawing Sheets

(56) References Cited

U.S. PATENT DOCUMENTS

2022/0271046 A1\* 8/2022 Huang ............... H01L 29/6684

FOREIGN PATENT DOCUMENTS

| JP | 2017-059751 A | 3/2017 |
| JP | 2019-169574 A | 10/2019 |
| JP | 2020-031213 A | 2/2020 |
| KR | 10-1176543 B1 | 8/2012 |
| KR | 10-1632496 B1 | 6/2016 |

OTHER PUBLICATIONS

Ali T et al: Theory and Experiment of Antiferroelectric(AFE) Si-Doped Hafnium Oxide (HSO) Enhanced Floating-Gate Memory, IEEE Transactions on Electron Devices, IEEE, USA, vol. 66, No. 8, Aug. 2019, pp. 3356-3364, XP011736078.
Extended European Search Report issued on Nov. 7, 2022 in European Application No. 22176314.7.
Notice of Grounds of Rejection issued Dec. 4, 2023 in Japanese Application No. 2022- 117302.
Notice of Grounds of Rejection issued May 7, 2024 in Japanese Application No. 2022-117302.

\* cited by examiner

ANTI-FERROELECTRIC THIN-FILM STRUCTURE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0096717, filed on Jul. 22, 2021, in the Korean Intellectual Property Office, the disclosure of which is incorporated by reference herein in its entirety.

BACKGROUND

1. Field

Embodiments relate to an anti-ferroelectric thin-film structure and an electronic device including the same.

2. Description of the Related Art

As electronic apparatuses are down-scaled, the available space to be occupied by electronic circuits in electronic apparatuses also decreases. Accordingly, there is a demand for miniaturization and high performance of electronic devices such as capacitors and transistors included in electronic circuits. To this end, in order to exhibit desired operating characteristics, even with a small thickness, research on a dielectric thin film having a high permittivity is continuing.

SUMMARY

Provided is an anti-ferroelectric thin-film structure having a high permittivity.

Provided is an electronic apparatus employing an anti-ferroelectric thin-film structure.

Additional aspects will be set forth in part in the description which follows and, in part, will be apparent from the description, or may be learned by practice of the presented embodiments of the disclosure.

According to an aspect of an example embodiment, an anti-ferroelectric thin-film structure includes a dielectric layer including an anti-ferroelectric phase of hafnium oxide; and an inserted layer in the dielectric layer, the inserted layer including an oxide.

The dielectric layer may include at least one of Y, Al, Ti, Sr, Zr, La or N as a dopant.

An amount of the dopant may be 50% or less of a total of elements of the dielectric layer.

When the oxide included in the inserted layer is expressed as $M_xO_y$, M may be at least one of Al, Ca, Sr, Ba, Sc, Y, La, Ti, Zr, Nb, Ta, Ce, Pr, Nd, Gd, Dy, Yb, or Lu.

A thickness of the inserted layer may be greater than 0% and less than or equal to 50% of a total thickness of the anti-ferroelectric thin-film structure.

The dielectric layer may include a first dielectric layer over the inserted layer and a second dielectric layer under the inserted layer. The first dielectric layer and second dielectric layer may have thicknesses that are greater than 0.

According to an aspect of another embodiment, an electronic device includes a lower electrode; an upper electrode; and the above-described anti-ferroelectric thin-film structure between the lower electrode and the upper electrode.

At least one of the lower electrode may include at least one a nitride, an oxide, or a metal oxide.

At least one of the lower electrode may include at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

The dielectric layer may include at least one of Y, Al, Ti, Sr, Zr, La or N as a dopant.

An amount of the dopant may be 50% or less of a total of elements of the dielectric layer.

When the oxide is expressed as $M_xO_y$, M may be at least one of Al, Ca, Sr, Ba, Sc, Y, La, Ti, Zr, Nb, Ta, Ce, Pr, Nd, Gd, Dy, Yb, or Lu.

A thickness of the inserted layer may be greater than 0% and less than or equal to 50% of a total thickness of the anti-ferroelectric thin-film structure.

The electronic device may further include a transistor electrically connected to at least one of the lower electrode or the upper electrode.

According to an aspect of another embodiment, an electronic device includes a semiconductor substrate; an upper electrode; and the anti-ferroelectric thin-film structure between the semiconductor substrate and the upper electrode.

The dielectric layer may include at least one of Y, Al, Ti, Sr, Zr, La or N as a dopant.

An amount of the dopant may be 50% or less of a total of elements of the dielectric layer.

When the oxide is expressed as $M_xO_y$, M may be at least one of Al, Ca, Sr, Ba, Sc, Y, La, Ti, Zr, Nb, Ta, Ce, Pr, Nd, Gd, Dy, Yb, or Lu.

A thickness of the inserted layer may be greater than 0% and less than or equal to 50% of a total thickness of the anti-ferroelectric thin-film structure.

The electronic device may further include an insulating layer between the semiconductor substrate and the anti-ferroelectric thin-film structure.

The electronic device may further include a conductive layer between the anti-ferroelectric thin-film structure and the insulating layer.

The conductive layer may include at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

The semiconductor substrate may include a source region, a drain region, and a channel region between the source region and the drain region, and the anti-ferroelectric thin-film structure is on the channel region.

The dielectric layer and the inserted layer may differ in at least one of charge, partial charge, or asymmetric charge distribution such that additional electric dipoles are formed at an interface between the between the dielectric layer and the inserted layer.

According to an aspect of another embodiment, a memory cell may include a charge storage device, the charge storage device including the above-described anti-ferroelectric thin-film structure. The charge storage device may be at least one of a capacitor or a floating gate.

According to an aspect of another embodiment, an electronic apparatus may include the above-described memory cell.

BRIEF DESCRIPTION OF THE DRAWINGS

The above and other aspects, features, and advantages of certain example embodiments of the inventive concepts will be more apparent from the following description taken in conjunction with the accompanying drawings, in which.

DETAILED DESCRIPTION

Figure 1:
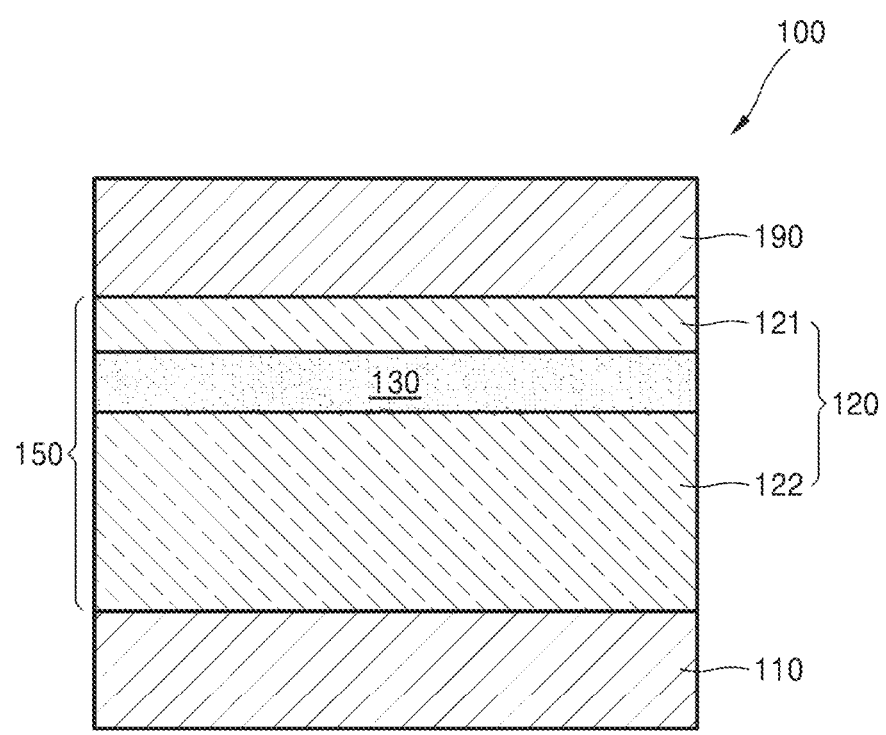
FIG. 1 is a cross-sectional view of a schematic structure of an electronic device including an anti-ferroelectric thin-film structure, according to some example embodiments.

Reference will now be made in detail to some example embodiments, examples of which are illustrated in the accompanying drawings, wherein like reference numerals refer to the like elements throughout. Like reference numerals in the drawings denote like elements, and, in the drawings, the sizes of elements may be exaggerated for clarity and for convenience of explanation. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "one or more of," when preceding a list of elements, modify the entire list of elements and do not modify the individual elements of the list.

It will be understood that when a layer is referred to as being "on" another layer or substrate, it can be directly on the other layer or substrate, or intervening layers may also be present. Spatially relative terms, such as "below," "lower," "above," "upper," and the like, may be used herein for ease of description to describe one element or feature's relationship to another element(s) or feature(s) as illustrated in the figures. It will be understood that if the device in the figures is turned over, elements described as "below," or "under," other elements or features would then be oriented "above" the other elements or features. Thus, the device may be otherwise oriented (rotated 90 degrees or at other orientations) and the spatially relative descriptors used herein interpreted accordingly.

Such terms as "first," "second," etc., may be used to describe various components, but are used only for the purpose of distinguishing one component from other components. These terms do not limit a difference in the materials or structures of the components unless otherwise indicated.

An expression used in the singular encompasses the expression of the plural, unless it has a clearly different meaning in the context. The terms "comprises" and/or "comprising" or "includes" and/or "including" when used in this specification, specify the presence of stated elements, but do not preclude the presence or addition of one or more other elements.

The terms "unit", "-er (-or)", and "module" when used in this specification refers to a unit in which at least one function or operation is performed, and may be implemented as hardware, software, or a combination of hardware and software. For example, the "unit", "-er (-or)", and "module" may include, and/or be included in, but are not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The use of the terms "a" and "an" and "the" and similar referents are to be construed to cover both the singular and the plural.

The operations that constitute a method can be performed in any suitable order unless otherwise indicated herein. The use of any and all exemplary language (e.g., "such as") provided herein is intended merely to explain the technical spirit of the disclosure in detail and does not pose a limitation on the scope of the disclosure unless otherwise claimed.

FIG. 1 is a cross-sectional view of a schematic structure of an electronic device including an anti-ferroelectric thin-film structure, according to some example embodiments.

The anti-ferroelectric thin-film structure 150, according to some example embodiments, includes hafnium oxide ($HfO_x$, e.g., $HfO_2$), and includes a dielectric layer 120 exhibiting an anti-ferroelectric phase and an inserted layer 130 inserted into the dielectric layer 120.

The electronic device 100, according to some example embodiment, includes a lower electrode 110 and an upper electrode 190 spaced apart from each other, and the anti-ferroelectric thin-film structure 150 disposed between the lower electrode 110 and the upper electrode 190. The electronic device 100 may be, e.g., a charge storage device such as a capacitor.

The anti-ferroelectric thin-film structure 150 is proposed as a structure that can exhibit a high permittivity and has an operating voltage section with little hysteresis.

Hafnium oxide included in the dielectric layer 120 may be utilized as a high-k dielectric material. Hafnium oxide may have paraelectricity, ferroelectricity, and/or anti-ferroelectricity, according to the type of a doping material, the amount of the doping material, a crystalline phase of the hafnium oxide, and/or the state of stress with adjacent layers. For example, hafnium oxide has ferroelectricity in an orthorhombic crystalline phase and anti-ferroelectricity in a tetragonal crystalline phase. The permittivity and/or hysteresis characteristics vary depending on these states. In some example embodiments, the phase of the hafnium oxide may be affected, for example, by stress on the lattice of the hafnium oxide. For example, in some example embodiments, the hafnium oxide may be induced into the tetragonal crystalline phase through stress due to, e.g., lattice mismatch with an adjacent layer, through internal stresses due to included doping materials, through external pressure and/or stressors, and/or the like. The composition and/or thickness of the hafnium oxide may also affect the phase change of the hafnium oxide.

The anti-ferroelectric thin-film structure 150 according to some example embodiments include the dielectric layer 120 including hafnium oxide ($HfO_2$) having an anti-ferroelectric phase to exhibit a high permittivity. The dielectric layer 120 may be doped with at least one of Y, Al, Ti, Sr, Zr, La or N. The amount of Y, Al, Ti, Sr, Zr, La and/or N doped may be an atomic ratio of 50% or less with respect to the entire element of the dielectric layer 120. For example, when the hafnium oxide is doped, e.g., with a dopant D, the doped hafnium oxide may be expressed as $Hf_{(1-x)}D_xO_2$, wherein, e.g., x may be 0.8 or less. The amount of the dopant D may be appropriately set according to the type of dopant.

The inserted layer 130 is a layer included in the dielectric layer 120. For example, the inserted layer 130 may be a layer embedded within the dielectric layer 120. When the area of the dielectric layer 120 is divided into a first dielectric layer 121 located on the inserted layer 130 and a second dielectric layer 122 located below the inserted layer 130, respective thicknesses of the first dielectric layer 121 and the second dielectric layer 122 are all set to be larger than 0. The inserted layer 130 may be referred to as a built-in field control layer.

For example, a built-in field, which is an electric field generated between the upper electrode 190 and the lower electrode 110 within the dielectric layer 120, is generated due to, for example, a work function difference at an electrode interface and a defect in the dielectric layer 120. This built-in field may be a cause of and/or contribute to the shift of capacitance-voltage behavior and/or the formation hysteresis within an operating voltage range. The inserted layer 130 may control the built-in field by forming an additional electric dipole or charge within the dielectric layer 120. For example, without being limited to a particular theory, the inserted layer 130 may form an electric field that offsets a built-in field.

The inserted layer 130 may include oxide. The oxide layer may be, for example, an insulating oxide layer. When the oxide included in the inserted layer 130 is expressed as $M_xO_y$, M may include at least one of Al, Ca, Sr, Ba, Sc, Y, La, Ti, Hf, Zr, Nb, Ta, Ce, Pr, Nd, Gd, Dy, Yb, or Lu. O is oxygen, and x and y are real numbers larger than 0. In some example embodiments, the oxide may have a band gap of 4 eV or more; and/or the oxygen ratio of the oxide may be less than or equal to an oxygen ratio of hafnium oxide (e.g., $HfO_2$). In some example embodiments, the distribution of charges (and/or partial charges) in the oxide may be different from charges (and/or partial charges) in the hafnium oxide and/or the oxide may have a greater than (or less than) degree of asymmetric charge distribution, thereby forming the additional electric dipole and/or charge at the interface between the inserted layer 130 and the dielectric layer 120.

For example, in some example embodiments, at least one of the oxidation number, the electronegativity, and/or the electronic structure of the oxide may be different from dielectric layer 120, such that the band alignment and/or the charge distribution of the anti-ferroelectric thin-film structure 150 may change compared to an anti-ferroelectric thin-film structure without the inserted layer 130.

A thickness of the inserted layer 130 may be larger than 0% and/or less than or equal to 50% of a total thickness of the anti-ferroelectric thin-film structure 150. The thickness of the inserted layer 130 may be, for example, 1% or more, 3% or more, 5% or more, 30% or less, and/or 10% or less of the total thickness of the anti-ferroelectric thin-film structure 150. The position of the inserted layer 130 is not particularly limited except that the inserted layer 130 is disposed inside the dielectric layer 120. For example, the inserted layer 130 may be disposed at an arbitrary position such as on a relatively upper, central, or lower side within the dielectric layer 120. A material included in the inserted layer 130 and a thickness thereof may be appropriately set to reduce hysteresis by controlling the built-in field within the dielectric layer 120.

Each of the upper electrode 190 and the lower electrode 110 may include a conductive material. For example, each of upper electrode 190 and the lower electrode 110 may include at least one of a metal, a metal nitride, a metal oxide, and/or a combination thereof.

The lower electrode 110 may be set to have a material enabling the dielectric layer 120 to have an anti-ferroelectric phase by providing an appropriate tensile stress to an interface with the dielectric layer 120. According to a tensile stress, the crystalline phase of hafnium oxide ($HfO_2$) may be changed to an orthorhombic crystalline phase representing ferroelectricity or a tetragonal crystalline phase representing anti-ferroelectricity. The lower electrode 110 may include, for example, at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U. The lower electrode 110 may be located below the anti-ferroelectric thin-film structure 150. For example, in some example embodiments, after the lower electrode 110 is manufactured, the anti-ferroelectric thin-film structure 150 may be formed on the lower electrode 110.

The anti-ferroelectric thin film structure 150 may be formed on the lower electrode 110, and the upper electrode 190 may be formed on the first dielectric layer 121. The anti-ferroelectric thin film structure 150 may be formed through various stacking methods. For example, the second dielectric layer 122, the inserted layer 130, and the first dielectric layer 121 may be sequentially formed using an atomic layer deposition (ALD) method. Taking the second dielectric layer 122 and the inserted layer 130, as examples, after forming a hafnium layer on the lower electrode 110 (e.g., by supplying an Hf precursor to a chamber), a purge operation is performed to remove remaining residual materials, and the hafnium layer is oxidized by injecting an oxidizing agent. The hafnium precursor may include, e.g., hafnium coordinated with a ligand, and the oxidizing agent may include, e.g., at least one of $O_2$, $O_3$, $H_2O$, $H_2O_2$ and/or the like. Then, a layer is formed by supplying an M-containing precursor to the chamber. Afterwards, a purge operation may be performed to remove the remaining materials, and the layer may be oxidized by injecting an oxidizing agent. After the $M_xO_y$ layer is formed on the hafnium oxide layer, a purge operation (e.g., for removing residual gas remaining in the chamber) may be performed. After depositing the anti-ferroelectric thin film 150 and/or the upper electrode 190 (e.g., using an atomic layer deposition method) a heat treatment process may be performed. For example, in some example embodiments, by controlling the heat treatment process and/or the concentration of dopants, the dielectric layer 120 may be an anti-ferroelectric layer.

The thickness of the inserted layer 130 may be a factor that affects polarization and capacitance of the anti-ferroelectric thin-film structure 150. An experimental result of the influence of the thickness of the inserted layer 130 will now be described with reference to FIGS. 2A through 3B.

Figure 2A:
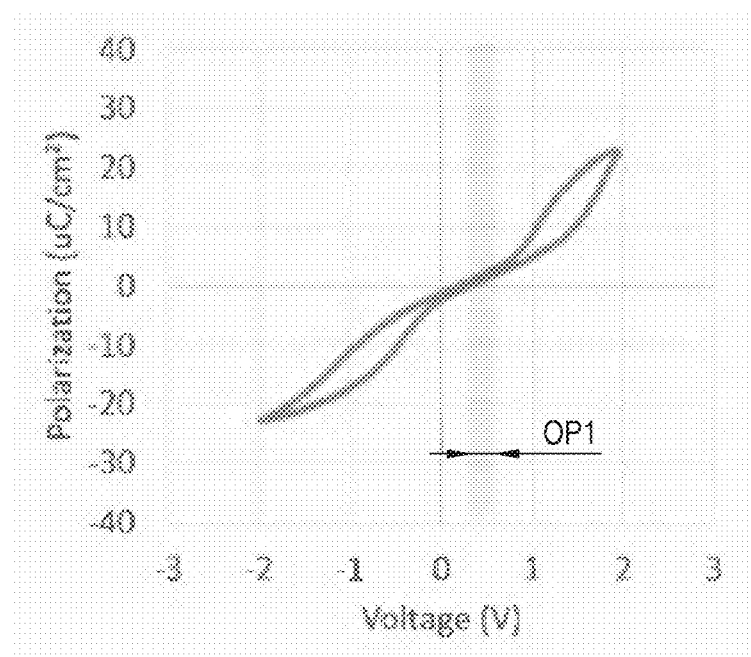
FIGS. 2A and 2B are graphs showing a hysteresis characteristic of polarization exhibited in the anti-ferroelectric thin-film structure of the electronic device of FIG. 1 with respect to different inserted layer thicknesses.
Figure 2B:
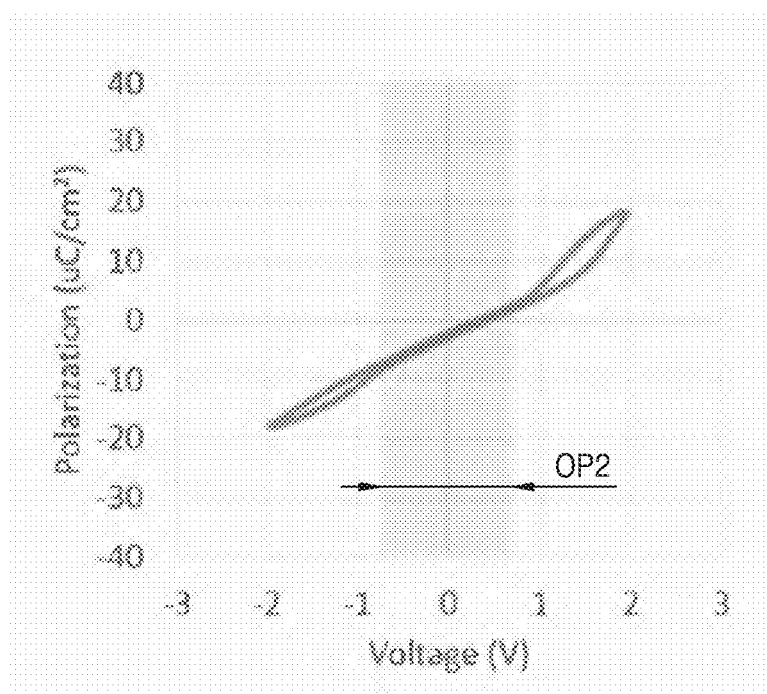

FIGS. 2A and 2B are graphs showing a hysteresis characteristic of polarization exhibited in the anti-ferroelectric thin-film structure 150 of the electronic device 100 of FIG. 1 with respect to different inserted layer thicknesses.

A polarization characteristic, e.g., due to an applied voltage, represents the hysteresis characteristic. As shown in the graphs of FIGS. 2A and 2B, an operating section with little hysteresis has different widths (e.g., OP1 and OP2).

The thicknesses of the inserted layers of FIGS. 2A and 2B are both greater than 0% and equal to or less than 10% of the total thickness of the anti-ferroelectric thin-film structure 150; the thickness of the inserted layer of FIG. 2A is smaller than the thickness of inserted layer of FIG. 2B.

It may be seen from FIGS. 2A and 2B that, as the thickness of the inserted layer increases within the aforementioned range, the width of the operating section with no hysteresis increases from OP1 to OP2, and the center of the operating section with no hysteresis is moved toward 0V. Accordingly, it may be seen that the thickness of the inserted layer affects the degree of controlling a built-in field and reduces hysteresis.

Figure 3A:
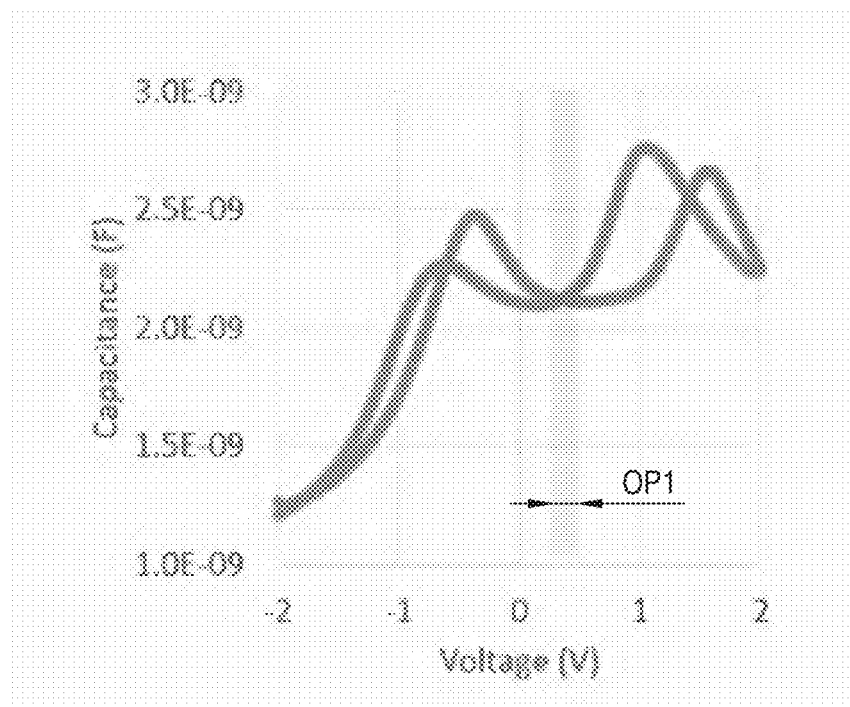
FIGS. 3A and 3B are graphs showing a hysteresis characteristic of capacitance exhibited in the electronic device of FIG. 1 with respect to different inserted layer thicknesses.
Figure 3B:
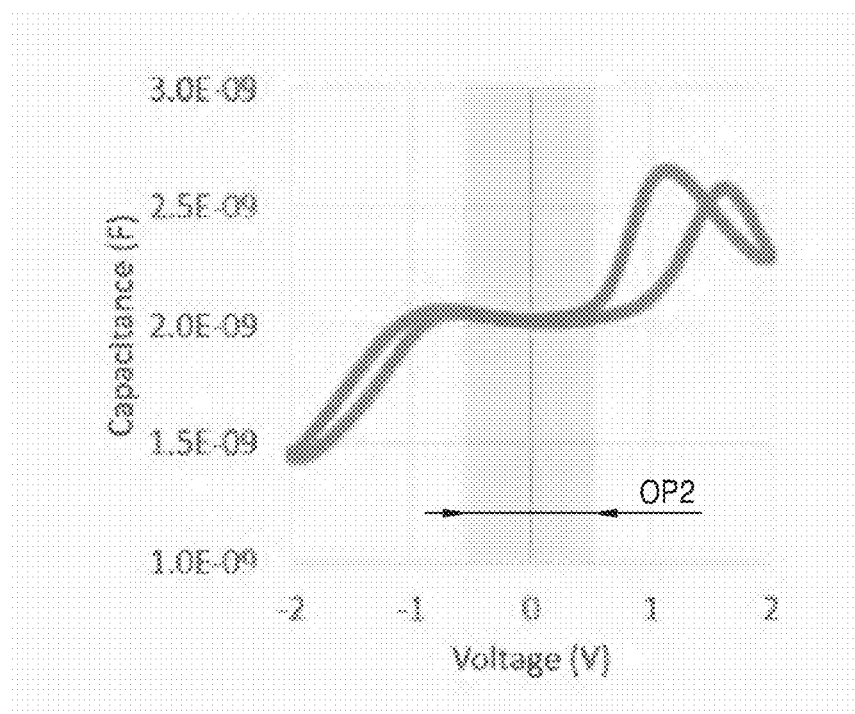

FIGS. 3A and 3B are graphs showing a hysteresis characteristic of capacitance exhibited in the electronic device 100 of FIG. 1 with respect to different inserted layer thicknesses.

FIGS. 3A and 3B correspond to FIGS. 2A and 2B, respectively, and show that hysteresis exhibited by the capacitance changes similarly according to the different inserted layer thicknesses.

Figure 4:
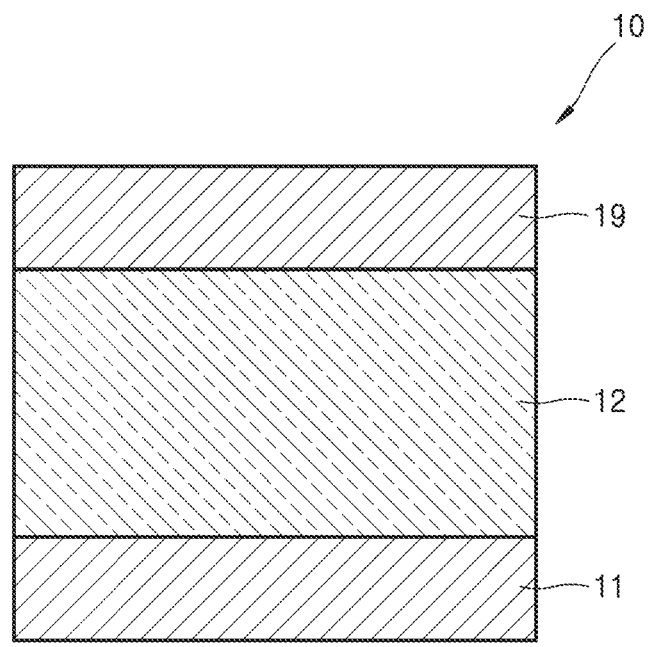
FIG. 4 is a cross-sectional view of a schematic structure of an electronic device according to a comparative example.
Figure 5:
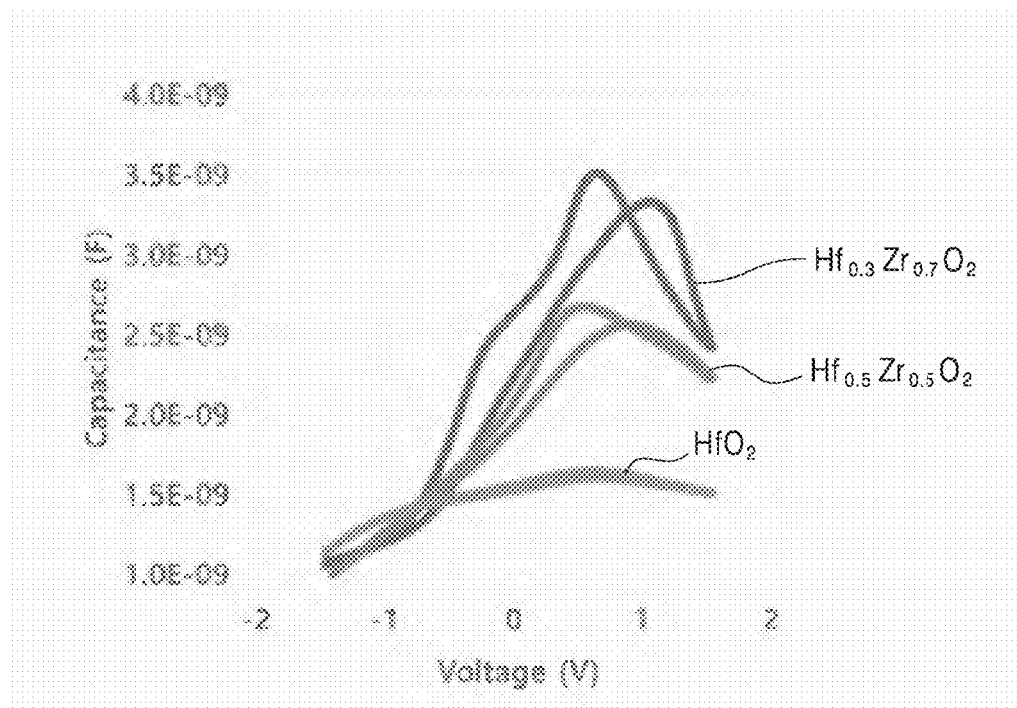
FIG. 5 is a graph showing a hysteresis characteristic of capacitance exhibited in the electronic device of FIG. 4 according to compositions of a dielectric layer of the electronic device.

FIG. 4 is a cross-sectional view of a schematic structure of an electronic device 10 according to a comparative example, and FIG. 5 is a graph showing a hysteresis characteristic of capacitance exhibited in the electronic device 10 of FIG. 4 according to compositions of a dielectric layer 12 of the electronic device 10.

The electronic device 10 includes a lower electrode 11, a dielectric layer 12, and an upper electrode 19, and, in contrast with the example embodiments, does not include an inserted layer.

Referring to the graph of FIG. 5, according to the composition of the dielectric layer 12 (e.g., in the cases of the composition as $Hf_{0.3}Zr_{0.7}O_2$, $Hf_{0.5}Zr_{0.5}O_2$, and $HfO_2$) the values of the capacitance varies, and the hysteresis characteristic also varies. For example, as a Zr content increases, the capacitance increases, but the hysteresis also increases. Thus, in the electronic device 10 according to a comparative example, only a case of $HfO_2$ composition exhibiting a low capacitance is applicable to a capacitor.

However, in the anti-ferroelectric thin-film structure 150 according to an embodiment, hysteresis may be reduced due to inclusion of the inserted layer 130. Thus, the another cases of composition ($Hf_{0.3}Zr_{0.7}O_2$, $Hf_{0.5}Zr_{0.5}O_2$) that both the capacitance and hysteresis are large as illustrated in FIG. 5, may be applied as a capacitor.

Figure 6A:
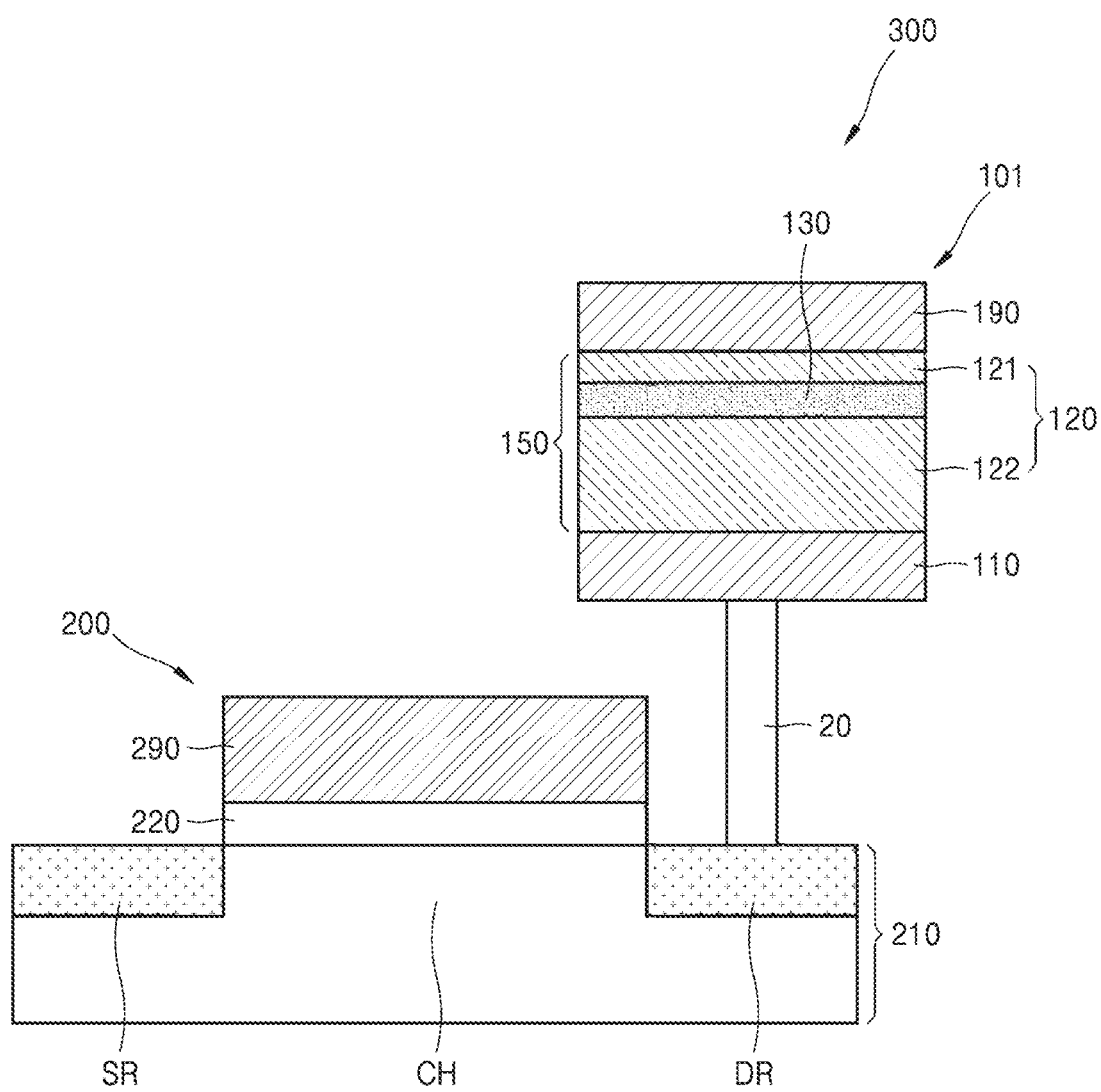
FIG. 6A is a cross-sectional view of a schematic structure of an electronic device according to some example embodiments.

FIG. 6A is a cross-sectional view of a schematic structure of an electronic device 300 according to some example embodiments.

The electronic device 300 has a structure in which a capacitor 101 is electrically connected to a transistor 200, and may be a component of an electronic circuit implemented as an integrated device.

The capacitor 101 includes the anti-ferroelectric thin-film structure 150 included in the electronic device 100 of FIG. 1, and may, for example, have substantially the same structure as the electronic device 100 of FIG. 1.

The capacitor 101 may be electrically connected to the transistor 200. For example, the capacitor 101 may be connected to the transistor by a contact 20. The transistor 200 may be an electric field effect transistor. One of the lower and upper electrodes 110 and 190 of the capacitor 101 may be electrically connected to one of a source SR and a drain DR of the transistor 200. For example, the lower electrode 110 may directly contact one of the source SR or drain DR and/or be connected by the contact 20.

The transistor 200 may include a semiconductor substrate 210 including a source SR, a drain DR, a channel CH, a gate electrode 290 disposed opposite to the channel CH, and a gate insulating layer 220 interposed between the channel CH and the gate electrode 290.

The semiconductor substrate 210 may include a semiconductor material. For example, the semiconductor material include at least one of as silicon (Si), germanium (Ge), silicon germanium (SiGe), silicon carbide (SiC), gallium arsenide (GaAs), indium arsenide (InAs), indium phosphide (InP), a transitional metal dichalcogenide, and/or the like. The semiconductor material may be modified in various forms such as silicon on insulator (SOI).

The channel CH may be electrically connected to the source SR and the drain DR. For example, the source SR may be electrically connected to and/or contact an end of the channel CH, and the drain DR may be electrically connected to and/or contact another end of the channel CH. In some example embodiments, the channel CH may be defined as a substrate region between the source SR and the drain DR within the semiconductor substrate 210 and/or a substrate region under the gate electrode 290.

The source SR, the drain DR, and the channel CH may be independently formed by injecting impurities into different regions of the semiconductor substrate 210. For example, the source SR, the channel CH, and the drain DR may include a substrate material as a base material. In some example embodiments, the impurities included in the source SR and drain DR may have different polarities and/or concentrations to the impurities included in the channel CH.

The source SR and/or the drain DR may include a conductive material, for example, at least one of a metal, a metal compound, or a conductive polymer. The conductive material may form an electrode on and/or in the source SR and/or the drain DR. The electrodes may be referred to, respectively, as a source electrode and a drain electrode.

In some example embodiments, the channel CH may be implemented as a separate material layer. For example, the channel CH may include an oxide semiconductor, a nitride semiconductor, an oxynitride semiconductor, a two-dimensional (2D) material, quantum dots, and/or an organic semiconductor. For example, the oxide semiconductor may include InGaZnO, the 2D material may include transition metal dichalcogenide (TMD) or graphene, and the quantum dots may include colloidal quantum dots (QDs), or a nanocrystal structure.

The gate electrode 290 may be disposed on the semiconductor substrate 210 to be apart from the semiconductor substrate 210 and face the channel CH. The gate electrode 290 may have, for example, a conductivity of 1 Mohm/square or less. The gate electrode 290 may include a conductive material such as at least one of a metal, a metal nitride, a metal carbide, and/or the like. For example, the metal may include aluminum (Al), tungsten (W), molybdenum (Mo), titanium (Ti), and/or tantalum (Ta), and the metal nitride may include titanium nitride (TiN) and/or tantalum nitride (TaN). The metal carbide may be a metal carbide doped with (and/or containing) aluminum and/or silicon, and examples of the metal carbide may include TiAlC, TaAlC, TiSiC, and TaSiC. The gate electrode 290 may have a structure in which a plurality of materials are stacked, for example, a stack structure of a metal nitride layer/metal layer such as TiN/Al and/or a stack structure of a metal nitride layer/metal carbide layer/metal layer such as TiN/TiAlC/W. The gate electrode 290 may include a titanium (TiN) layer or molybdenum (Mo), and the aforementioned example may be used in various modified forms.

The gate insulating layer 220 between the semiconductor substrate 210 and the gate electrode 290 may include a paraelectric material and/or a high-k material, and may have, for example, a dielectric constant of 20 to 70. The gate insulating layer 220 may include an insulating material such as at least one of silicon oxide, silicon nitride, aluminum oxide, hafnium oxide, zirconium oxide a 2D insulator such as hexagonal boron nitride (h-BN). For example, the gate insulating layer 220 may include silicon oxide ($SiO_2$), silicon nitride ($SiN_x$), hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), and/or the like.

The gate insulating layer 220 may include a metal nitride oxide (such as aluminum oxynitride (AlON), zirconium oxynitride (ZrON), hafnium oxynitride (HfON), lanthanum oxynitride (13hos), or yttrium oxynitride (YON)), a silicate (such as, ZrSiON, HfSiON, YsiON, or LaSiON), and/or an aluminate (such as, ZrAlON or HfAlON). The gate insulating layer 220 may comprise a plurality of layers. In some example embodiments, the gate insulating layer 220 may include the anti-ferroelectric thin-film structure 150. The gate insulating layer 220 may constitute a gate stack, together with the gate electrode 290.

The contact 20 may include a conductive material, for example, tungsten, copper, aluminum, polysilicon, or the like.

The layout of the capacitor 101 and the transistor 200 may vary. For example, the capacitor 110 may be disposed on the semiconductor substrate 210 as shown in FIG. 6A, and/or may have a structure in which the capacitor 110 is embedded within the semiconductor substrate 210.

Although FIG. 6A illustrates the electronic device 300 including the single capacitor 101 and the single transistor 200, an electronic device according to another embodiment may have a structure in which the structure of FIG. 6A is repeatedly arranged in a 2D manner such as a grid. The electronic device 300 may be included, for example, as and/or in a memory cell and/or device.

Figure 6B:
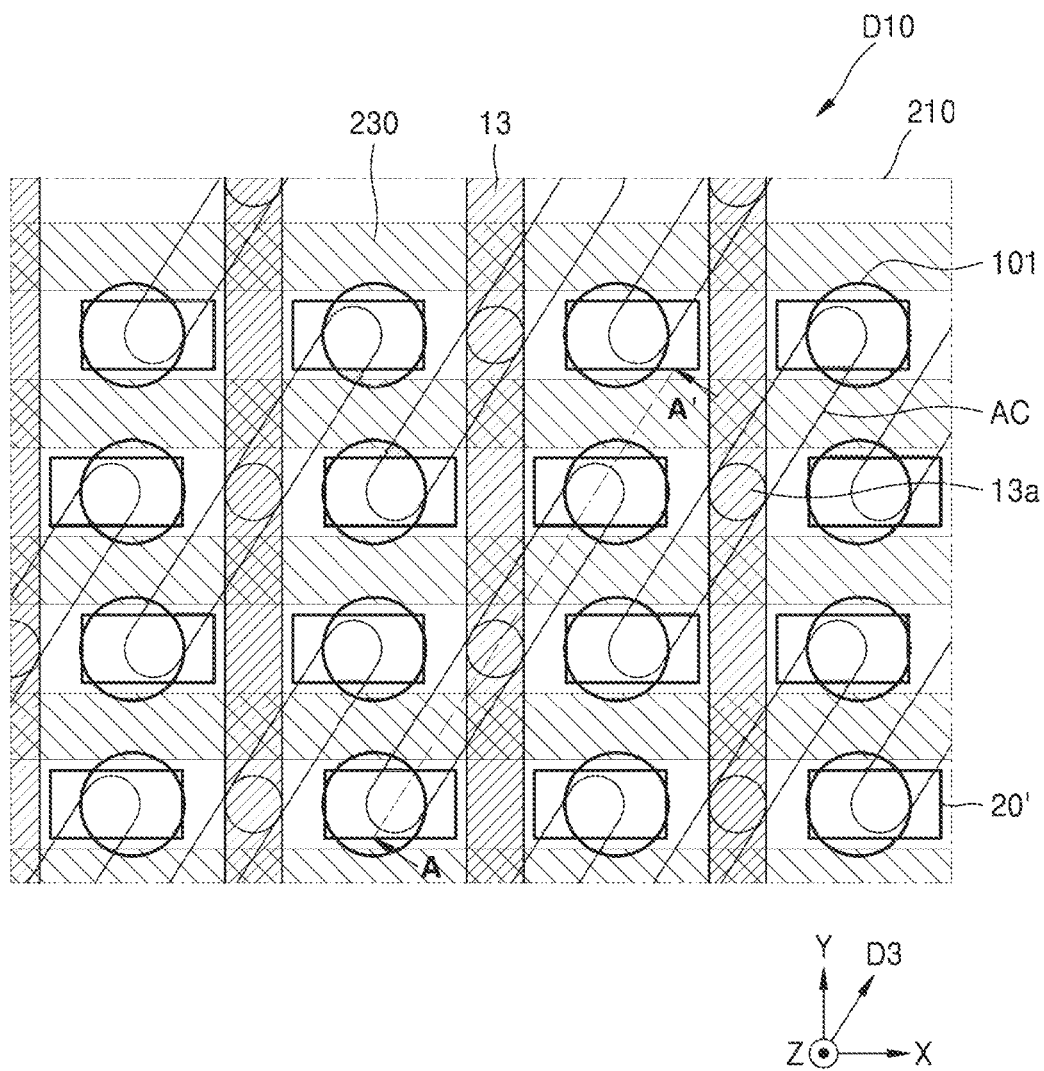
FIG. 6B is a layout view illustrating a semiconductor apparatus according to some example embodiments.

For example, referring to FIG. 6B, the semiconductor apparatus D10 may include the field effect transistors including gate stacks 230, including a gate electrode (e.g., the gate electrode 290 and the gate insulating layer 220 of FIG. 6A) and a substrate 210, which has sources, drains, and channels; contact structures 20' arranged on the substrate 210 without overlapping the gate stacks 230; and the capacitors 101 arranged on the contact structures 20'. The semiconductor apparatus D10 may further include bit line structures 13, which electrically connect the field effect transistors to each other. FIG. 6B illustrates the semiconductor apparatus D10 in which the contact structures 20' and the capacitors 101 are repeatedly arranged in X and Y directions, but this is a non-limiting example. For example, the contact structures 20' may be arranged in the X and Y directions, and the capacitors 101 may be arranged in a hexagonal shape such as a honeycomb structure.

Figure 6C:
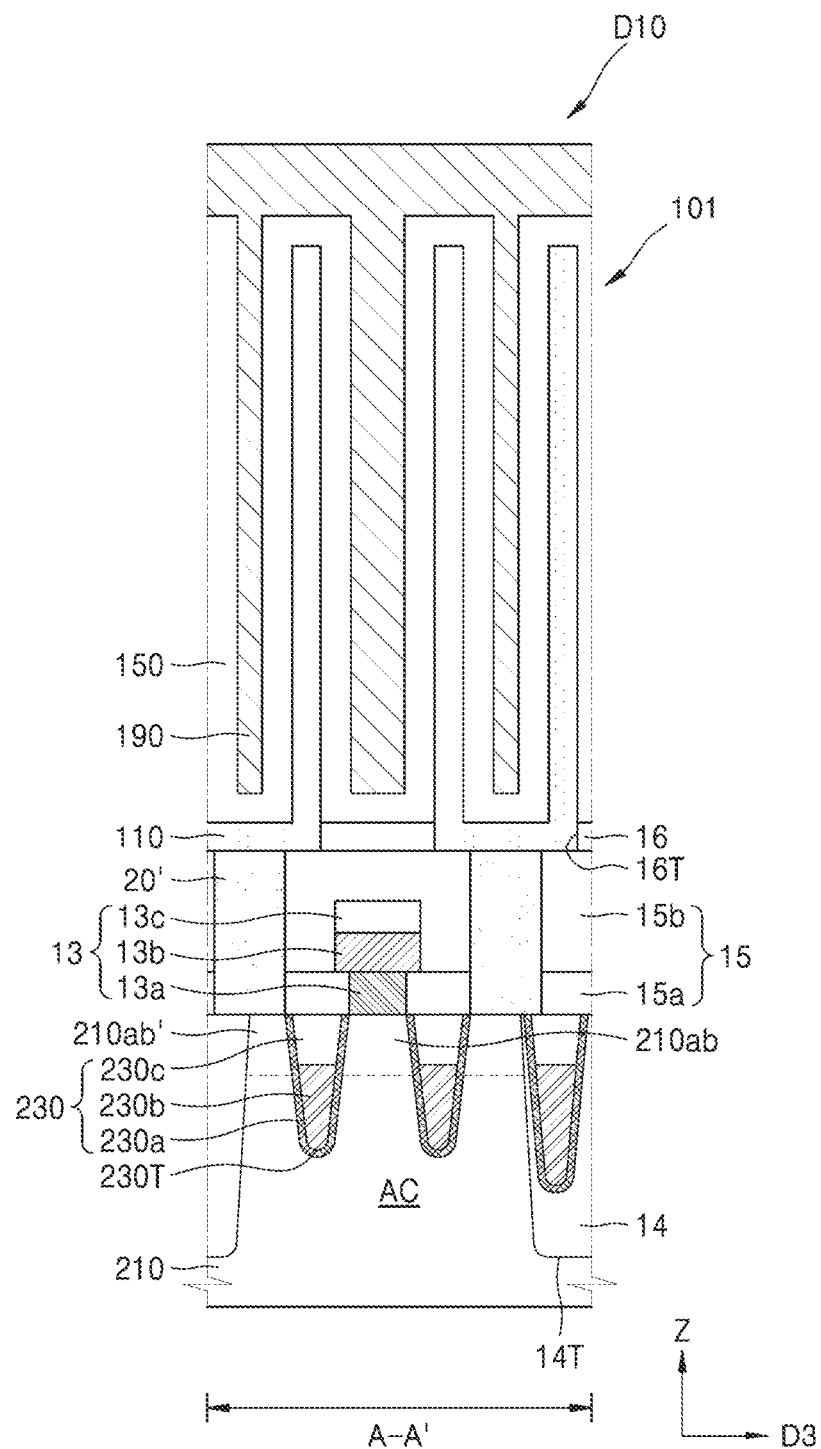
FIGS. 6C and 6D are cross-sectional views of the semiconductor device shown in FIG. 6B, which are taken along line A-A' of FIG. 6B.

FIG. 6C is a cross-sectional view taken along line A-A of FIG. 6B to show an example structure of the semiconductor apparatus D10. Referring to FIG. 6C, the substrate 210 may have a shallow trench isolation (STI) structure including a device isolation layer 14. The device isolation layer 14 may be a single layer including a single type of insulating layer and/or may have a multilayer structure including a combination of two or more types of insulating layers. The device isolation layer 14 may include a device isolation trench 14T in the substrate 210, and the device isolation trench 14T may be filled with an insulating material. The insulation material may include, but is not limited thereto, fluoride silicate glass (FSG), undoped silicate glass (USG), boro-phospho-silicate glass (BPSG), 14 hosphor-silicate glass (PSG), flowable oxide (FOX), plasma enhanced tetra-ethyl-ortho-silicate (PE-TEOS), and/or a polysilazane (e.g., tonen silazane (TOSZ).

In addition, the substrate 210 may further include an active region AC, which is defined by the device isolation layer 14; and a gate line trench 230T, which may be arranged parallel to the upper surface of the substrate 210 and/or extend in the X direction. The active region AC may have a relatively long island shape having a short axis and a long axis. The long axis of the active region AC may be arranged in a direction D3 parallel to the upper surface of the substrate 210, as illustrated in FIG. 6C. The gate line trench 230T may have a given (and/or otherwise determined) depth from the upper surface of the substrate 210 and may be arranged in the active region AC or across the active region AC. A gate line trench 230T may also be provided inside the device isolation trench 230T, and the gate line trench 230T provided inside the device isolation trench 230T may have a bottom lower than the bottom of the gate line trench 230T provided in the active region AC.

A first source/drain 210*ab* and a second source/drain 210*ab'* may be arranged in upper portions of the active region AC at both sides of the gate line trench 230T.

A gate stack 230 may be arranged inside the gate line trench 230T. For example, a gate insulating layer 230*a*, a gate electrode 230*b*, and a gate capping layer 230*c* may be sequentially arranged inside the gate line trench 230T. The gate insulating layer 230*a* and the gate electrode 230*b* may be the same as those described above, and the gate capping layer 230*c* may include silicon oxide, silicon oxynitride, and/or silicon nitride. The gate capping layer 230*c* may be arranged on the gate electrode 230*b* to fill the remaining portion of the gate line trench 230T.

In addition, a bit line structure 13 may be arranged on the first source/drain 11'*ab*. The bit line structure 13 may be parallel to the upper surface of the substrate 210 and may extend in the Y direction. The bit line structure 13 may be electrically connected to the first source/drain 11'*ab*, and may include a bit line contact 13*a*, a bit line 13*b*, and/or a bit line capping layer 13*c*, which are sequentially formed on the substrate 210. For example, the bit line contact 13*a* may include polysilicon, the bit line 13*b* may include a metallic material, and the bit line capping layer 13*c* may include an insulating material such as silicon nitride (SiN) and/or silicon oxynitride (SiON).

FIG. 6C illustrates that the bit line contact 13*a* has a bottom surface at the same level as the upper surface of the substrate 210. However, the bit line contact 13*a* may extend into a recess (not shown) formed to a predetermined (and/or otherwise desired) depth from the upper surface of the substrate 210 such that the bottom surface of the bit line contact 13a may be lower than the upper surface of the substrate 210.

Optionally, the bit line structure 13 may include a bit line intermediate layer (not shown) between the bit line contact 13a and the bit line 13b. The bit line intermediate layer may include a metal silicide such as tungsten silicide and/or a metal nitride such as tungsten nitride. In addition, a bit line spacer (not shown) may be further formed on a sidewall of the bit line structure 13. The bit line spacer may have a single layer structure and/or a multilayer structure and may include an insulating material such as silicon oxide, silicon oxynitride, and/or silicon nitride. In addition, the bit line spacer may further include an air space (not shown).

A contact structure 20' may be arranged on the second source/drain 210ab'. The contact structure 20' and the bit line structure 13 may be arranged on different source/drains in the substrate 210. The contact structure 20' may have a structure in which a lower contact pattern (not shown), a metal silicide layer (not shown), and/or an upper contact pattern (not shown) are sequentially stacked on the second source/drain 210ab'. In addition, the contact structure 20' may further include a barrier layer (not shown), which surrounds at least one of the side and/or bottom surfaces of the upper contact pattern. In some embodiments, the lower contact pattern may include a conductive and/or semiconductive material (e.g., polysilicon), the upper contact pattern may include a conductive material (e.g., a metallic material), and/or the barrier layer may include a conductive material resistance to degradation and/or defect (and/or inclusion) diffusion (e.g., a conductive metal nitride).

A capacitor 100 may be electrically connected to the contact structure 20' and may be arranged above the substrate 210. For example, the capacitor 100 may have a lower electrode 110 electrically connected to the contact structure 20', an anti-ferroelectric thin-film structure 150 arranged on the lower electrode 110, and an upper electrode 190 arranged on the anti-ferroelectric thin-film structure 150. The anti-ferroelectric thin-film structure 150 may be arranged on the lower electrode 110 in parallel to the surface of the lower electrode 110.

An interlayer insulating layer 15 may be further arranged between the capacitor 1' and the substrate 210. The interlayer insulating layer 15 may be arranged in spaces between the capacitor 100 and the substrate 210 in which no other structures are arranged. For example, the interlayer insulating layer 15 may cover wiring and/or electrode structures such as the bit line structure 13, the contact structure 20', and the gate stack 230, which are formed on or in the substrate 210. For example, the interlayer insulating layer 15 may surround walls of the contact structure 20'. The interlayer insulating layer 15 may include a first interlayer insulating layer 15a, which surrounds the bit line contact 13a; and a second interlayer insulating layer 15b, which covers side surfaces and/or upper surfaces of the bit line 13b and the bit line capping layer 13c.

The lower electrode 110 of the capacitor 101 may be arranged on the interlayer insulating layer 15 (for example, on the second interlayer insulating layer 15b of the interlayer insulating layer 15). In addition, when a plurality of capacitors 101 may be arranged, bottom surfaces of a plurality of lower electrodes 110 may be separated from each other by an etch stop layer 16. For example, the etch stop layer 16 may include openings 16T, and the bottom surfaces of the lower electrodes 110 of the capacitors 10 may be arranged in the openings 16T.

Figure 6D:
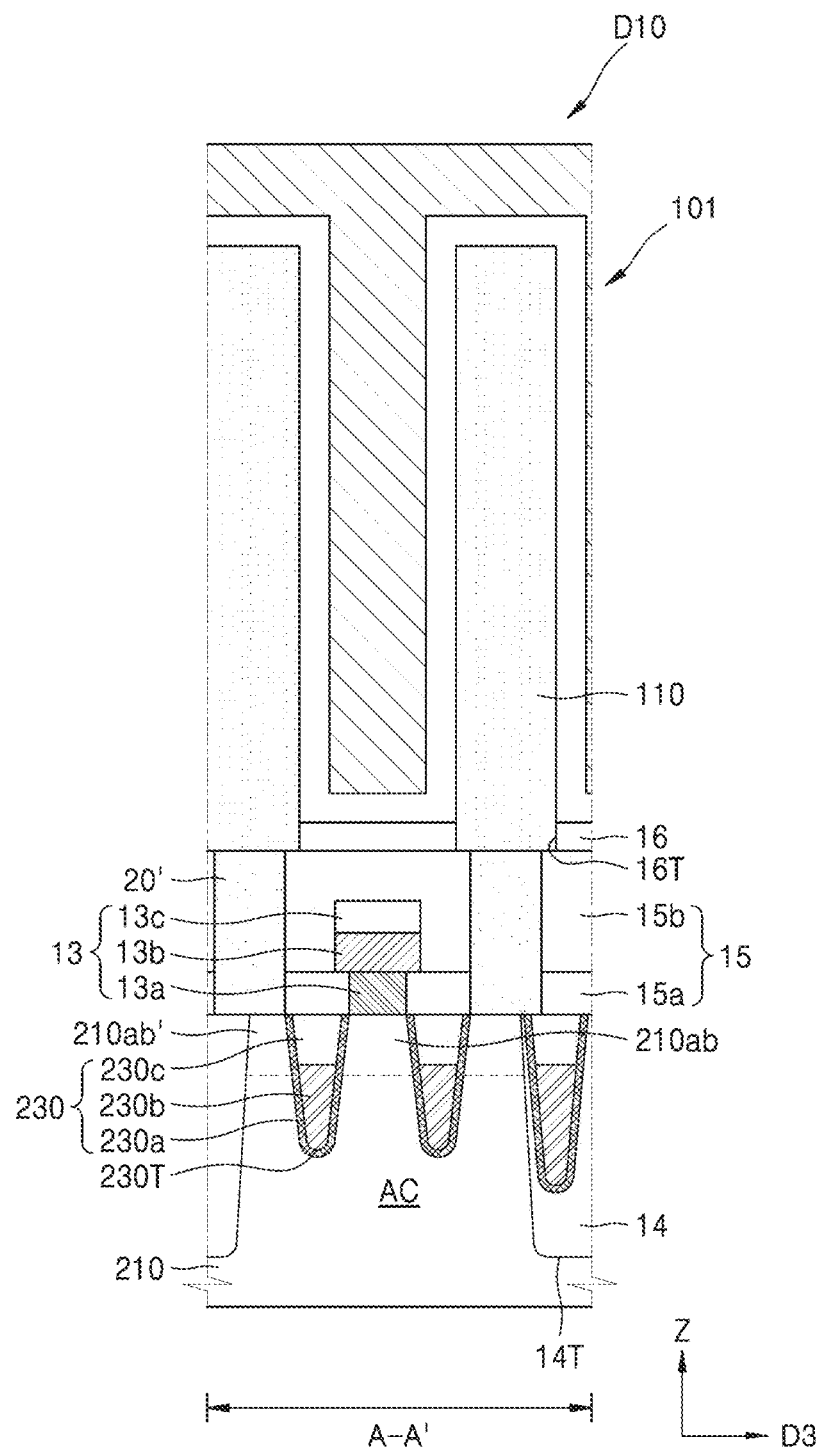

As shown in FIG. 6C, the lower electrodes 110 may have a cylindrical shape or a cup shape with a closed bottom. In another example, as shown in FIG. 6D, the lower electrode 110 may have a pillar shape such as a circular pillar, a rectangular pillar, or a polygonal pillar, which extends in a vertical direction (Z direction).

In addition, the capacitor 100 may further include a support (not shown) that prevents the lower electrode 110 from tilting or collapsing. For example, the support may be arranged on sidewalls of the lower electrode 110.

The above-described embodiments illustrate electronic devices in which the electronic device 100 is applied as a capacitor 101. However, the anti-ferroelectric thin-film structure 150 according to some embodiment may be applied to a logic device.

Figure 7:
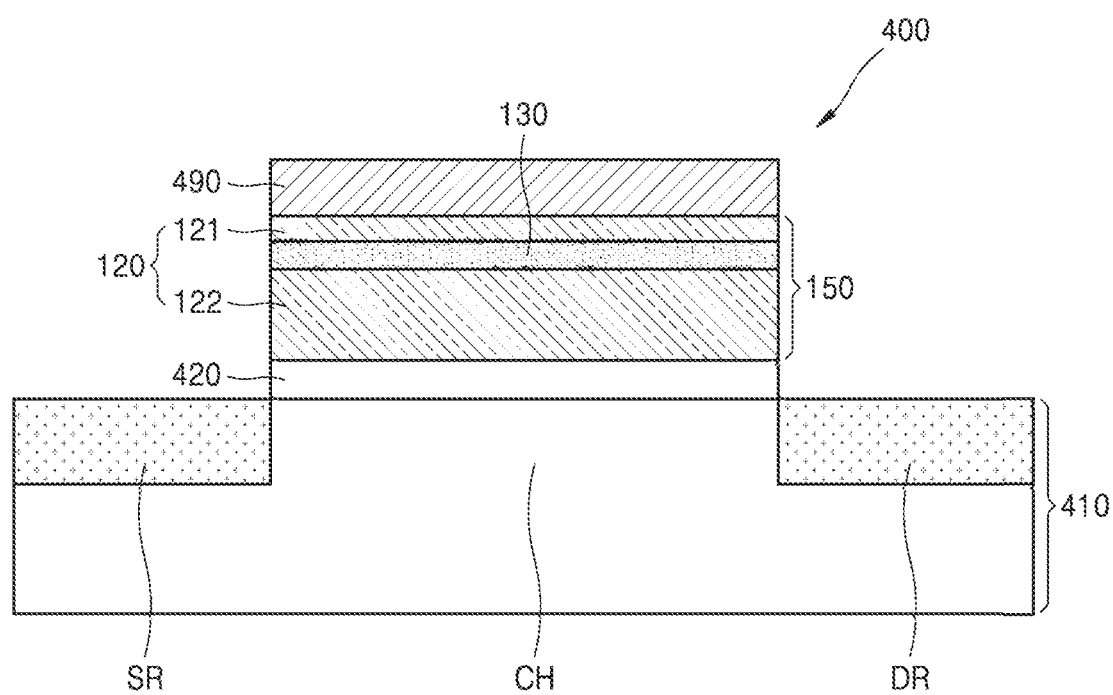
FIG. 7 is a cross-sectional view of a schematic structure of an electronic device according to some example embodiments.

FIG. 7 is a cross-sectional view of a schematic structure of an electronic device 400 according to some example embodiments.

The electronic device 400 includes a semiconductor substrate 410, and the anti-ferroelectric thin-film structure 150 disposed on the semiconductor substrate 410. An insulating layer 420 may be interposed between the semiconductor substrate 410 and the anti-ferroelectric thin-film structure 150. An upper electrode 490 may be arranged on the anti-ferroelectric thin-film structure 150.

The semiconductor substrate 410 may include a source SR, a drain DR, and a channel CH electrically connected to the source SR and the drain DR. The semiconductor substrate 410 may be the same and/or substantially similar to the semiconductor substrate 210 of FIG. 6.

The upper electrode 490 may be referred to as a gate electrode. The upper electrode 490 may include a material and structure illustrated as the material and structure of the gate electrode 290 of FIG. 6. For example, the upper electrode 490 may include a metal, a metal nitride, a metal carbide, and/or a combination thereof, and may have a structure of a plurality of layers. The upper electrode 490 may also be the same, and/or substantially similar to the upper electrode 190 of FIG. 1.

The insulating layer 420 may be a layer for suppressing and/or preventing electrical leakage, and may include a dielectric material. The insulating layer 420 may include a plurality of material layers having different dielectric constants. The insulating layer 420 may include an insulating material such as at least one of SiO, AlO, HfO, ZrO, LaO, YO, MgO, and/or a 2D insulator. A material such as h-BN may be used as the 2D insulator. The material of the insulating layer 420 is not limited thereto.

The electronic device 400 may be a logic transistor in which the anti-ferroelectric thin-film structure 150 is used in a domain switching operation.

The anti-ferroelectric material included in the anti-ferroelectric thin-film structure 150 may include a ferroelectric domain where electric dipoles are arrayed, and remnant polarization represents 0 (and/or a value close to 0) when an external electric field is not applied. In the anti-ferroelectric material, when an external electric field is applied, the direction of polarization may be switched.

As described above, the anti-ferroelectric thin-film structure 150, according to some example embodiments, includes the dielectric layer 120 including an anti-ferroelectric phase of $HfO_2$, and the inserted layer 130 inserted into the dielectric layer 120 (e.g., interposed between the first dielectric layer 121 and the second dielectric layer 122). Accordingly, the anti-ferroelectric thin-film structure 150 has a wide range capable of exhibiting a substantially non-hysteresis behavior characteristic at a polarization variation according to an external electric field. For example, the anti-ferroelectric thin-film structure 150 may seldom exhibit a hysteresis characteristic during a domain switching operation.

Figure 8:
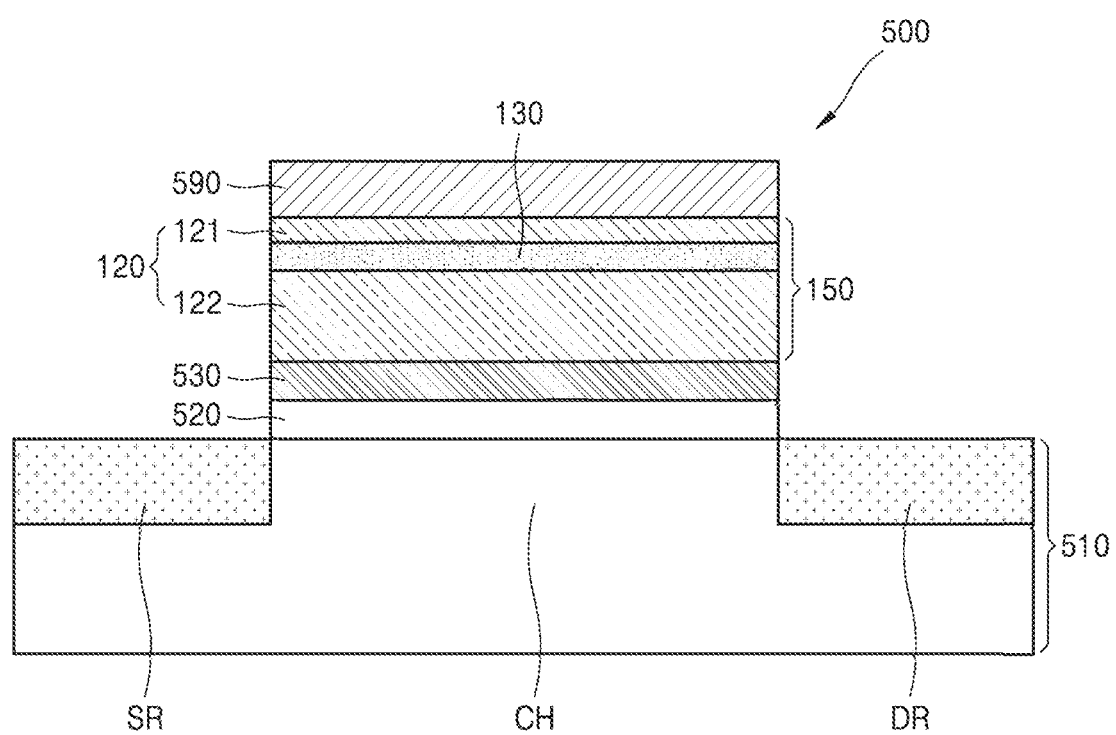
FIG. 8 is a cross-sectional view of a schematic structure of an electronic device according to some example embodiments.

FIG. 8 is a cross-sectional view of a schematic structure of an electronic device 500 according to some example embodiments.

Similar to the electronic device 400 of FIG. 7, the electronic device 500 may be a logic transistor in which the anti-ferroelectric thin-film structure 150 is used in a domain switching operation.

The electronic device 500 includes a semiconductor substrate 510, and the anti-ferroelectric thin-film structure 150 disposed on the semiconductor substrate 510. An insulating layer 520 may be included between the semiconductor substrate 510 and the anti-ferroelectric thin-film structure 150, and a conductive layer 530 may be included between the insulating layer 520 and the anti-ferroelectric thin-film structure 150. An upper electrode 590 may be arranged on the anti-ferroelectric thin-film structure 150. The upper electrode 590 may be referred to as a gate electrode.

The semiconductor substrate 510 may include a source SR, a drain DR, and a channel CH electrically connected to the source SR and the drain DR. The semiconductor substrate 510 may be similar to the semiconductor substrate 410 of FIG. 7 and/or the semiconductor substrate 210 of FIG. 6A.

The conductive layer 530 between the anti-ferroelectric thin-film structure 150 and the insulating layer 520 may be set to have a material enabling the dielectric layer 120 to have an anti-ferroelectric phase by providing an appropriate tensile stress to an interface with the dielectric layer 120. The conductive layer 530 may be the same and/or substantially similar to the lower electrode 110 of FIG. 1. The conductive layer 530 may include, for example, at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and/or U.

In some example embodiments, the conductive layer 530 may be configured as a floating gate, and the electronic device 500 may be a floating gate transistor (FGT). For example, the electronic device 500 may be configured to store (e.g., trap) charge to and/or discharge charge from the conductive layer 530. In some embodiments, for example, if a negative charge is stored in the conductive layer 530 (e.g., through tunneling and/or electron injection), the flow of current may be prevented and/or mitigated even when a charge is applied to the upper electrode 590. In some example embodiments, the electronic device 500 may serve as a charge (and/or data) storage cell in, e.g., an erasable programmable read-only memory (EPROM) and/or and electrically EPROM (EEPROM).

Figure 9:
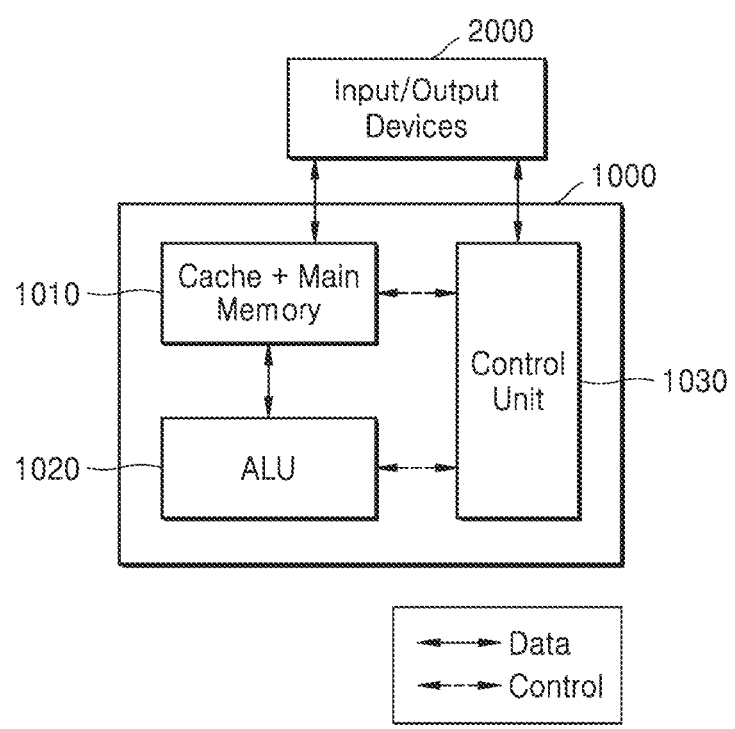
FIGS. 9 and 10 are conceptual views schematically illustrating device architectures applicable to an electronic apparatus, according to some example embodiments.
Figure 10:
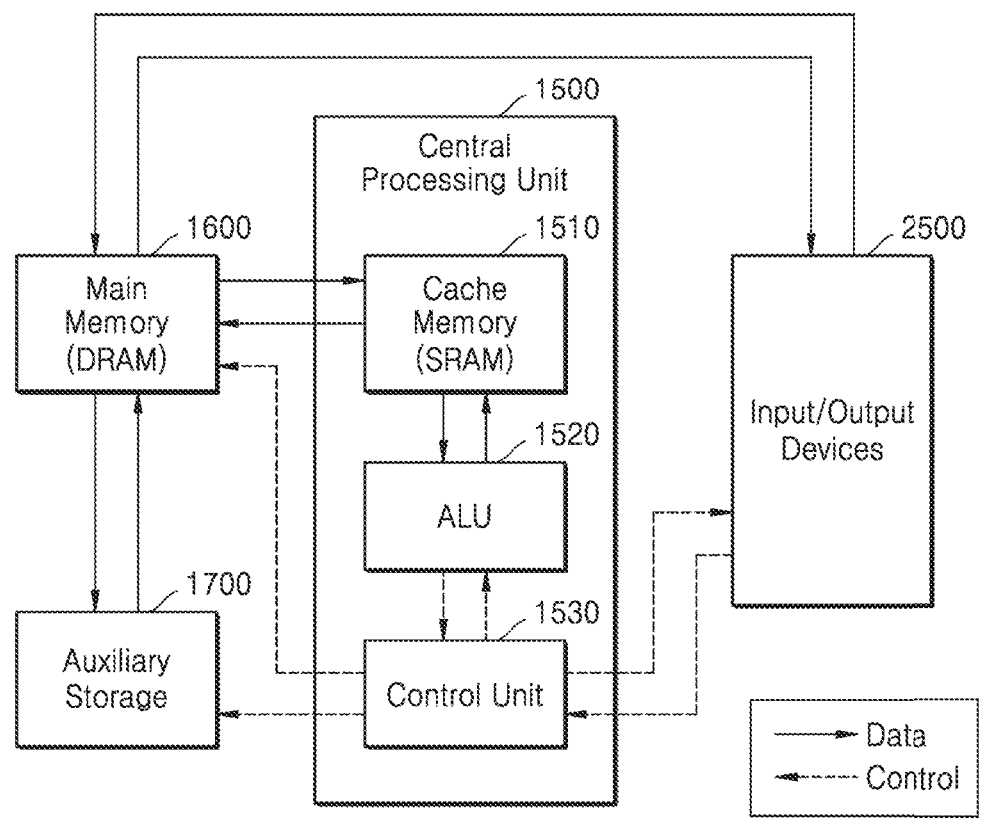

FIGS. 9 and 10 are conceptual views schematically showing device architectures applicable to an electronic apparatus, according to some example embodiments.

Referring to FIG. 9, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030. The memory unit 1010, the ALU 1020, and the control unit 1030 may directly communicate with one another by, for example, mutual connections to a metal line in on-chip. In some example embodiments, the memory unit 1010, the ALU 1020, and the control unit 1030 may be monolithically integrated on one substrate, thereby forming one chip. Input/output devices 2000 may be connected to the electronic device architecture (chip) 1000 and may be configured to input and/or output information. For example, the input/output devices 2000 may include, but are not limited to, a screen, touch pad, keyboard, bus, microphone, camera, etc. Furthermore, the memory unit 1010 may include both main memory and cache memory. The electronic device architecture (chip) 1000 may be an on-chip memory processing unit.

The memory unit 1010, the ALU 1020, and/or the control unit 1030 each may independently include an electronic device employing the above-described anti-ferroelectric thin-film structure. This electronic device may be a logic transistor and/or a capacitor.

Referring to FIG. 10, a cache memory 1510, an ALU 1520, and a control unit 1530 may constitute a central processing unit (CPU) 1500, and a cache memory 1510 may include static random access memory (SRAM). Aside from the CPU 1500, a main memory 1600 and an auxiliary storage 1700 may be provided, and input/output devices 2000 may also be provided. The main memory 1600 may be dynamic random-access memory (DRAM), and may include an electronic device, for example, a capacitor, employing the above-described anti-ferroelectric thin-film structure.

In some cases, the electronic device architecture may be implemented such that, without distinction of sub-units, computing unit devices and memory unit devices are mutually adjacent to each other in one chip.

The above-described anti-ferroelectric thin-film structure has a wide operating section without hysteresis, and also exhibits a high dielectric constant.

The anti-ferroelectric thin-film structure may be used in various electronic devices such as a transistor, a capacitor, and/or an integrated circuit device.

An electronic device to which the above-described anti-ferroelectric thin-film structure has been applied may secure an operating voltage section with little hysteresis.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. An anti-ferroelectric thin-film structure comprising:
   a dielectric layer including an anti-ferroelectric phase of hafnium oxide; and
   an inserted layer in the dielectric layer, the inserted layer including an oxide,
   wherein a ratio of a thickness of the inserted layer and a thickness of the dielectric layer is set such that a range of an operating section of the dielectric layer with no hysteresis includes zero (0) volts.
2. The anti-ferroelectric thin-film structure of claim 1, wherein the dielectric layer includes at least one of Y, Al, Ti, Sr, Zr, La or N as a dopant.

3. The anti-ferroelectric thin-film structure of claim 2, wherein an amount of the dopant is 50% or less of a total of elements of the dielectric layer.

4. The anti-ferroelectric thin-film structure of claim 1, wherein the oxide included in the inserted layer is expressed as $M_xO_y$, and
M is at least one of Al, Ca, Sr, Ba, Sc, Y, La, Ti, Zr, Nb, Ta, Ce, Pr, Nd, Gd, Dy, Yb, or Lu.

5. The anti-ferroelectric thin-film structure of claim 1, wherein the thickness of the inserted layer is greater than 0% and less than or equal to 50% of a total thickness of the anti-ferroelectric thin-film structure.

6. The anti-ferroelectric thin-film structure of claim 1, wherein the dielectric layer includes
a first dielectric layer including the anti-ferroelectric phase of hafnium oxide over the inserted layer, and
a second dielectric layer including the anti-ferroelectric phase of hafnium oxide under the inserted layer, and
wherein the first dielectric layer and second dielectric layer have thicknesses that are greater than 0.

7. An electronic device comprising:
a lower electrode;
an upper electrode; and
an anti-ferroelectric thin-film structure between the lower electrode and the upper electrode,
wherein the anti-ferroelectric thin-film structure comprises
a first dielectric layer including hafnium oxide in an anti-ferroelectric phase,
a second dielectric layer including hafnium oxide in the anti-ferroelectric phase, and
an inserted layer between the first dielectric layer and the second dielectric layer and being in contact with the first dielectric layer and the second dielectric layer,
wherein the first dielectric layer is in contact with the upper electrode, and second dielectric layer is in contact with the lower electrode, and
wherein a thickness of the inserted layer is equal to or greater than 5% and less than or equal to 10% of a total thickness of the anti-ferroelectric thin-film structure.

8. The electronic device of claim 7, wherein at least one of the lower electrode or the upper electrode comprises at least one of a metal, a metal nitride, or a metal oxide.

9. The electronic device of claim 8, wherein the at least one of the lower electrode or the upper electrode comprises at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

10. The electronic device of claim 7, wherein at least one of the first or the second dielectric layers includes at least one of Y, Al, Ti, Sr, Zr, La or N as a dopant.

11. The electronic device of claim 10, wherein an amount of the dopant is 50% or less of a total of elements of the first or the second dielectric layers.

12. The electronic device of claim 7, wherein the oxide is expressed as $M_xO_y$, and
M is at least one of Al, Ca, Sr, Ba, Sc, Y, La, Ti, Zr, Nb, Ta, Ce, Pr, Nd, Gd, Dy, Yb, or Lu.

13. The electronic device of claim 7, further comprising:
a transistor electrically connected to at least one of the lower electrode or the upper electrode.

14. An electronic device comprising:
a semiconductor substrate;
an upper electrode; and
an anti-ferroelectric thin-film structure between the semiconductor substrate and the upper electrode,
wherein the anti-ferroelectric thin-film structure comprises
a first dielectric layer including hafnium oxide in an anti-ferroelectric phase,
a second dielectric layer including hafnium oxide in the anti-ferroelectric phase, and
an inserted layer between the first dielectric layer and the second dielectric layer and being in contact with the first dielectric layer and the second dielectric layer,
wherein the first dielectric layer is in contact with the upper electrode, and
wherein a thickness of the inserted layer is equal to or greater than 5% and less than or equal to 10% of a total thickness of the anti-ferroelectric thin-film structure.

15. The electronic device of claim 14, wherein at least one of the first or the second dielectric layers includes at least one of Y, Al, Ti, Sr, Zr, La or N as a dopant.

16. The electronic device of claim 15, wherein an amount of the dopant is 50% or less of a total of elements of the first or the dielectric layers.

17. The electronic device of claim 14, wherein the oxide is expressed as $M_xO_y$, and
M is at least one of Al, Ca, Sr, Ba, Sc, Y, La, Ti, Zr, Nb, Ta, Ce, Pr, Nd, Gd, Dy, Yb, or Lu.

18. The electronic device of claim 14, further comprising:
an insulating layer between the semiconductor substrate and the anti-ferroelectric thin-film structure.

19. The electronic device of claim 18, further comprising:
a conductive layer between the anti-ferroelectric thin-film structure and the insulating layer.

20. The electronic device of claim 19, wherein the conductive layer includes at least one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

21. The electronic device of claim 14, wherein the semiconductor substrate includes a source region, a drain region, and a channel region between the source region and the drain region, and
the anti-ferroelectric thin-film structure is on the channel region.

22. The anti-ferroelectric thin-film structure of claim 1, wherein the dielectric layer and the inserted layer differ in at least one of charge, partial charge, or asymmetric charge distribution such that electric dipoles are formed at an interface between the dielectric layer and the inserted layer.

23. A memory cell comprising:
a charge storage device, the charge storage device including the anti-ferroelectric thin-film structure of claim 1.

24. The memory cell of claim 23, wherein
the charge storage device is at least one of a capacitor or a floating gate.

25. An electronic apparatus comprising:
the memory cell of claim 23.

26. An electronic device comprising:
a lower electrode;
an upper electrode; and the anti-ferroelectric thin-film structure of claim 1 between the lower electrode and the upper electrode.

27. An electronic device comprising:
a semiconductor substrate;
an upper electrode; and
the anti-ferroelectric thin-film structure of claim 1 between the semiconductor substrate and the upper electrode.

\* \* \* \* \*